United States Patent [19]

Tawata et al.

[11] Patent Number: 5,570,506
[45] Date of Patent: Nov. 5, 1996

[54] METHOD FOR FORMING MULTILAYER WIRING CONSTRUCTION

[75] Inventors: Rie Tawata; Shunichi Numata; Takao Miwa; Koji Fujisaki, all of Hitachi; Takayoshi Ikeda, Ibaraki; Yoshiaki Okabe; Hisae Shimanoki, both of Hitachi, all of Japan

[73] Assignee: Hitachi, Ltd., Tokyo, Japan

[21] Appl. No.: 463,562

[22] Filed: Jun. 5, 1995

Related U.S. Application Data

[62] Division of Ser. No. 834,837, Feb. 13, 1992, abandoned.

[30] Foreign Application Priority Data

Feb. 18, 1991 [JP] Japan ..................... 3-023106

[51] Int. Cl.$^6$ ........................................ H01K 3/22
[52] U.S. Cl. .................. 29/851; 29/830; 29/831; 428/473.5
[58] Field of Search .............. 29/830, 846, 851, 29/831; 428/473.5, 901; 361/792

[56] References Cited

U.S. PATENT DOCUMENTS

| | | | |
|---|---|---|---|
| 4,673,773 | 6/1987 | Nakano et al. ................ | 361/792 X |
| 4,939,039 | 7/1990 | Watanabe ..................... | 428/473.5 X |
| 5,072,075 | 12/1991 | Lee et al. .................... | 29/846 X |

OTHER PUBLICATIONS

IBM Technical Disclosure Bulletin "Multilayer Circuit Board Fabrication", vol. 10, No. 4, Sep. 1967.

Primary Examiner—Peter Vo
Assistant Examiner—Khan Nguyen
Attorney, Agent, or Firm—Antonelli, Terry, Stout & Kraus

[57] ABSTRACT

Low-thermal-expansivity polyimides have a linear rigid skeleton, so that adhesion between perfectly cured low-thermal-expansivity polyimide films is very low. On the other hand, a film of a polyimide having a flexible skeleton shows high adhesiveness even after perfect curing, so that it is possible to enhance adhesion between the low-thermal-expansivity polyimide films by interposing a polyimide having a flexible skeleton. A flexible polyimide thin film is formed as a highly adhesive film on a low-thermal-expansivity polyimide film in a half-cured state, then metallic wiring is applied thereon, followed by formation of another highly adhesive thin film in a half-cured state, and then a low-thermal-expansivity polyimide film is further formed thereon. It is possible to provide a multilayer wiring structure which has improved adhesion between the low-thermal-expansivity polyimide film and the wiring pattern layer or the substrate.

3 Claims, 2 Drawing Sheets

1: SUBSTRATE
2,4,6: POLYIMIDE (FLEXIBLE)
3,7: LOW-THERMAL-EXPANSIVITY POLYIMIDE
5: METALLIC WIRING

1: SUBSTRATE
2,4,6: POLYIMIDE (FLEXIBLE)
3,7: LOW-THERMAL-EXPANSIVITY POLYIMIDE
5: METALLIC WIRING

MEASUREMENT OF PEEL STRENGTH
POLYIMIDE ON SiO2

MEASUREMENT OF PEEL STRENGTH
POLYIMIDE ON POLYIMIDE

METHOD FOR FORMING MULTILAYER WIRING CONSTRUCTION

This application is a Divisional application of application Ser. No. 834,837, filed Feb. 13, 1992, now abandoned.

BACKGROUND OF THE INVENTION

This invention relates to a multilayer wiring structure featuring use of a polyimide for the insulating layer. More particularly, the invention pertains to a multilayer wiring structure which is reduced in thermal stress by use of a low-thermal-expansivity polyimide for the layer insulating films and also has high bonding reliability between conductor/insulating film or insulating film/conductor or at the interface between the insulating films.

Polyimide resins are used as material of layer insulating films for multilayer wiring boards as said resins are excellent in heat resistance, chemical resistance and insulating properties and low in dielectric constant. However, the conventional polyimides, when used for forming the layer insulating films, present the problem of cracking or imperfect adhesion due to build-up of thermal stress after heat curing, that is, the stress caused by the difference in thermal expansion coefficient between the substrate or wiring material and the polyimide. For avoiding this problem, it is desirable to use a polyimide having a thermal expansion coefficient as close to that of the substrate or wiring material as possible. For instance, it is effective to apply, for forming the insulating films, a low-thermal-expansivity polyimide having a thermal expansion coefficient of $2\times10^{-5}K^{-1}$ or less, which is close to that of the substrate or wiring material, owing to its rod-like structure as disclosed in Japanese Patent Application Kokai (Laid-Open) No. 61-176196. However, when a film or layer of a material is formed directly (without applying any treatment) on an insulating layer using a perfectly cured low-thermal-expansivity polyimide, there could take place exfoliation at the interface between the insulating layers or between the insulating layer and wiring metal, and thus there arises the problem of reliability. As a method for solving such a problem, Japanese Patent Application Kokai No. H1-245586 discloses use of a flexible printed board in which the insulator consists of a layer of a high-thermal-expansivity resin contacting the conductor and a layer of a low-thermal-expansivity resin contacting the first-said resin layer for improving adhesiveness between the conductor and the insulator. However, in the multilayer wiring boards having multilayer wiring comprising a plural number of insulating film layers and a plural number of conductor patterns, such as wiring boards for modules, multilayer flexible printed boards, LSI multilayer wiring boards, etc., high adhesiveness is required not only for conductor/polyimide interface but also for substrate/polyimide and polyimide/polyimide interfaces, so that it was necessary to take a measure that can satisfy both requirements for low-thermal-expansivity and high adhesiveness at various interfaces.

As a method for laminating a polyimide with low adhesiveness, use of FEP (perfluoroethylene-perfluoropropylene copolymer) as a heat-fusible adhesive is proposed in Japanese Patent Application Kokai No. 57-83432. However, FEP is lower in heat resistance (especially in softening point and melting point) than polyimides and can not provide satisfactory heat resistance.

Also, the idea of laminating the cured polyimide films by using a half-cured polyamic acid film is proposed in Japanese Patent Publication No. 57-5229, but little improvement of adhesiveness is admitted with the perfectly cured low-thermal-expansivity polyimide.

It is known that silicon-modified polyimides such as disclosed in Japanese Patent Application Kokai No. 62-227963 are enhanced in adhesiveness to glass or silicon substrates. However, in case a low-thermal-expansivity polyimide film is formed on a cured silicon-modified low-thermal-expansivity polyimide film, there is the problem that adhesion between the polyimide insulating films is low.

Thus, in forming the multilayer wiring boards of the type in which there exists various types of interfaces, it was impossible with the conventional techniques to satisfy both requirements for high adhesion at all interfaces and low thermal expansivity at the same time.

As described above, it was difficult to form a multilayer wiring structure by using a low-thermal-expansivity polyimide for the layer insulating films.

SUMMARY OF THE INVENTION

The object of the present invention is to accomplish multilayer wiring with high reliability by improving adhesiveness at various interfaces applied with polyimide while maintaining low thermal expansivity when forming a multilayer wiring structure using a low-thermal-expansitivity polyimide.

For attaining said object, there is provided a multilayer construction in which a flexible and highly adhesive thin insulating film is disposed on the upper and lower sides of the low-thermal-expansivity polymer layers and the conductor pattern layers, thereby making it possible to offer a multilayer wiring structure with high reliability.

BRIEF DESCRIPTION OF THE DRAWINGS

The essentials of the present invention are described hereinafter with reference to the accompanying drawings wherein.

DETAILED DESCRIPTION OF THE INVENTION

Figure 1:
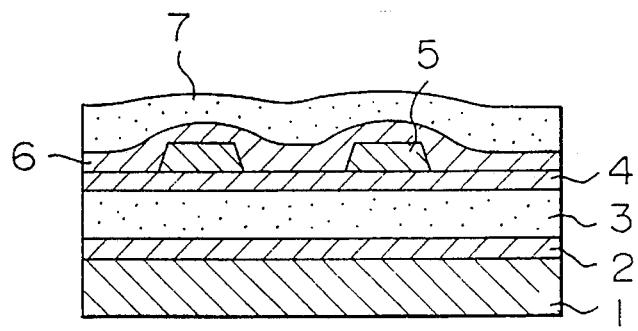
FIG. 1 is a sectional view of a high-density multilayer wiring board.

In FIG. 1, the multilayer wiring board comprises a substrate 1, a highly adhesive and flexible polyimide thin film 2, a low-thermal-expansivity polyimide 3, a highly adhesive and flexible polyimide thin film 4, metallic wiring 5, a highly adhesive polyimide thin film 6, and a low-thermal-expansivity polyimide 7.

In a first aspect of the present invention, there is provided a multilayer wiring structure comprising a plural number of conductor pattern layers and a plural number of low-thermal expansivity polymer insulating film layers, characterized in that the coefficient of thermal expansion of the low-thermal-expansivity polymer constituting the insulating films is $2\times10^{-5}K^{-1}$ to $4\times10^{-6}K^{-1}$, and a film of a polyimide with a flexible skeleton having at least one highly flexible bond in the main chain is formed on the upper and lower sides of said conductor pattern layers and said low-thermal-expansivity polymer insulating film layers. Low-thermal-expansivity polyimides, aromatic heterocyclic polymers and the like are usable for forming said low-thermal-expansivity polymer insulating films in the present invention. The flexible and highly adhesive polyimide film (the above-mentioned film of a polyimide with a flexible skeleton) is most preferably used in a half-cured state, but in case it is necessary to form a metallic wiring pattern layer on a perfectly or fully cured film, wiring is applied on a perfectly cured interface-modified film, followed by formation thereon of a highly adhesive thin film of polyimide, and then an insulating film of a low-thermal-expansivity polymer is further formed thereon.

In a second aspect of this invention, there is provided a multilayer wiring structure comprising a plural number of conductor pattern layers and a plural number of low-thermal-expansivity polymer insulating film layers, characterized in that a polymer film is formed on the upper and lower sides of said conductor pattern layers and said layers of insulating films, that the peel strength of bond between the conductor pattern layer or insulating film of low-thermal-expansivity polymer and said polyimide film is 200–1,000 g/cm, and that heat resistance of said polyimide film is such that the weight loss starting temperature of said polyimide film in the air is 400°–600° C.

In a third aspect of the present invention, there is provided a method for producing a multilayer wiring structure having a construction in which a flexible and highly adhesive thin insulating film is disposed on the upper and lower sides of the low-thermal-expansivity polymer layers and the conductor pattern layers.

In a fourth aspect of the present invention, there are provided multilayer flexible printed boards, high-density multilayer wiring boards and semiconductor devices utilizing a multilayer wiring structure having a construction in which a flexible and highly adhesive thin insulating film is disposed on the upper and lower sides of the low-thermal-expansivity polymer layers and the conductor pattern layers.

In the present invention, the low-thermal-expansivity layer is made of a polymer having a thermal expansion coefficient of $2\times10^{-5}K^{-1}$ to $4\times10^{-6}K^{-1}$ at temperatures of 50°–200° C. and a value of Khun's segment of 90 or more. Measurement of the value is described in T. M. Birshtein, Polymer Science USSR, 19, 63, (1977), and T. M. Birshtein, V. A. Zubov, I. S. Milevskaya, V. E. Eskin, I. A. Baranovskaya, M. M. Koton, V. V. Kudryavtsev, and V. P. Sklizzkova, Europe Polymer Journal, 13, 375, (1977).

Typical examples of such polymers are aromatic heterocyclic polymers such as polyimide, polybenzimidazole, polybenzoxazole, polybenzthiazole, polypyrrolone and the like. The polyimide has, for example, chemical structural units represented by the following formula:

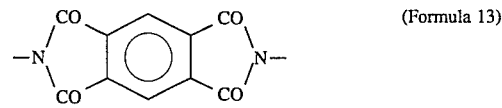

(Formula 13)

and/or

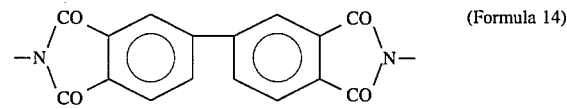

(Formula 14)

The low-thermal-expansivity polyimide used in this invention is composed of the structural units of the formula:

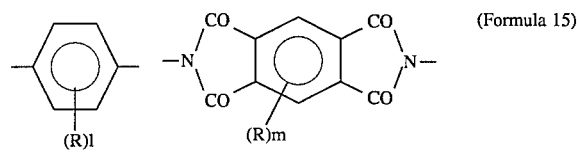

(Formula 15)

and/or

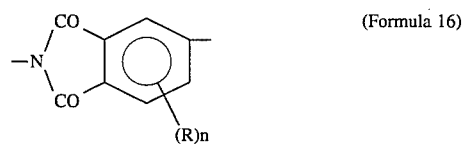

(Formula 16)

wherein R is selected from $C_{1-6}$ alkyl group, fluorinated $C_{1-6}$ alkyl group, $C_{1-6}$ alkoxyl group, fluorinated $C_{1-6}$ alkoxyl group, $C_{1-6}$ acyl group and halogen; 1 is an integer of 0 to 4; m is an integer of 0 to 2; and n is an integer of 0 to 3.

The structural unit of the polyimide molecule is selected from those of the following formulae:

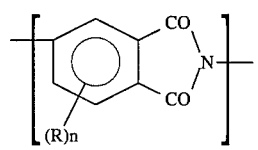

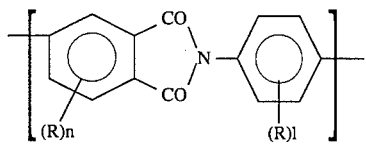

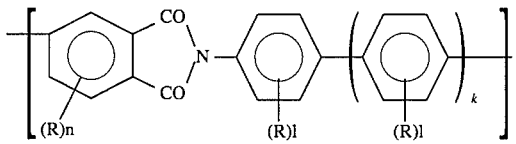

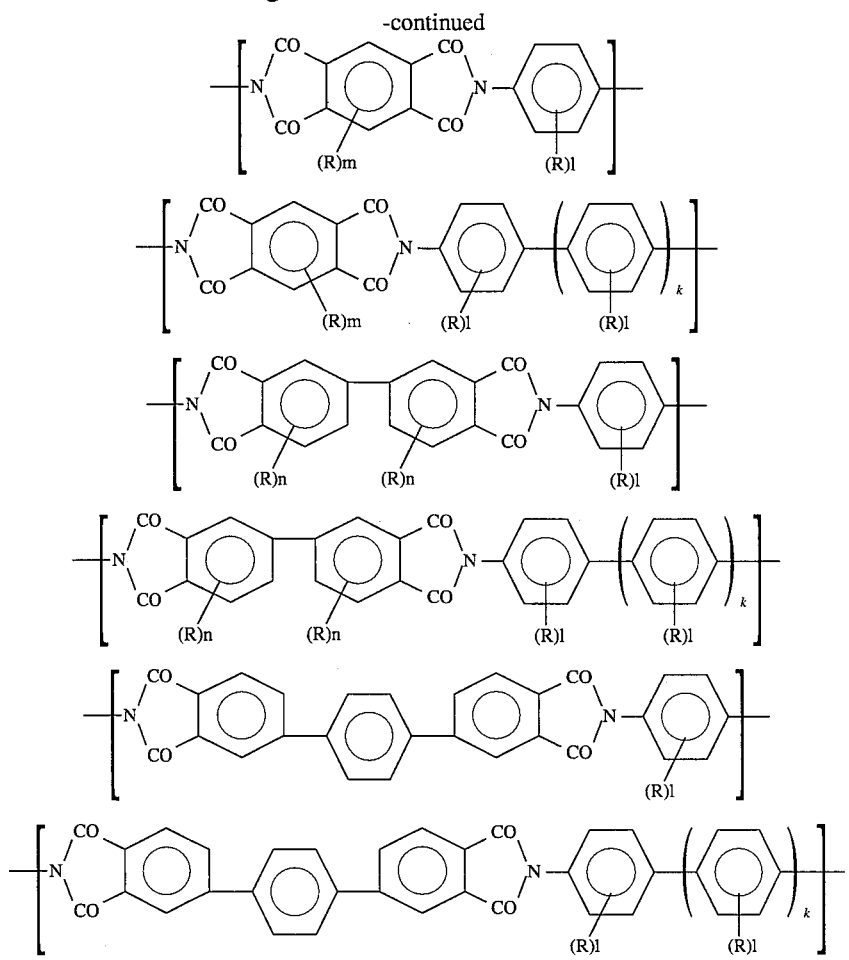

(Formula 17)

wherein R is selected from alkyl group, fluorinated alkyl group, alkoxyl group, fluorinated alkoxyl group, acyl group and halogen as heretofore defined; k is an integer of 0 to 3; l is an integer of 0 to 4; m is an integer of 0 to 2; and n is an integer of 0 to 3.

This polyimide may be blended or copolymerized with other polymer(s). For example, there may be used a copolymer of polyimide and polyamide, and a blend of polyimide with polyamide, polybenzoxazole, polybenzothiazole or polypyrrolone.

The polyimide having such a skeleton can be obtained from single polymerization of an aromatic diaminocarboxylic acid derivative or from reaction of an aromatic diamine or an aromatic diisocyanate and an aromatic tetracarboxylic acid derivative.

The tetracarboxylic acid derivatives usable in the above reaction include esters, acid anhydrides and acid chlorides. Use of an acid anhydride is preferred from the viewpoint of synthesis. The synthesis reaction is usually carried out in a solvent such as N-methyl-pyrrolidone, dimethylformamide, dimethylacetamide, dimethyl sulfoxide, dimethyl sulfate, sulforan, butyrolactone, cresol, phenol, phenol halide, cyclohexane, dioxane and the like at a temperature in the range of 0° to 200° C.

The diaminocarboxylic acid derivatives usable for said polymerization in this invention include 4-aminophthalic acid, 4-amino-5-methylphthalic acid, 4-(p-anilino)phthalic acid, 4-(3,5-dimethyl-4-anilino)phthalic acid and the like as well as their esters, acid anhydrides and acid chlorides.

The aromatic diamines usable for said reaction in this invention include p-phenylenediamine, 2,5-diaminotoluene, 2,5-diaminoxylene, diaminodurene-(2,3,5,6-tetramethyl-p-phenylenediamine), 2,5-diaminobenzotrifluoride, 2,5-diaminoanisole, 2,5-diaminoacetophenone, 2,5-diaminobenzophenone, 2,5-diaminodiphenyl, 2,5-diaminofluorobenzene, benzidine, o-tolidine, m-tolidine, 3,3'-dimethoxybenzidine, 3,3',5,5'-tetramethylbenzidine, 3,3'-di(trifluoromethyl)benzidine, 3,3'-diacetylbenzidine, 3,3'-difluorobenzidine, octafluorobenzidine, 4,4'-diaminoterphenyl and 4,4'-diaminooctaphenyl.

The diisocyanate compounds of the above diamines can be used as well.

The tetracarboxylic acid derivatives usable in the above reaction include pyromellitic acid, methylpyromellitic acid, dimethylpyromellitic acid, di(trifluoromethyl)pyromellitic acid, 3,3',4,4'-biphenyltetracarboxylic acid, p-(3,4-dicarboxyphenyl)benzene, and their acid anhydrides, acid chlorides and esters.

For improving adhesion to the substrate made of Si, $SiO_2$, Al, SiN or the like, a diaminosiloxane represented by the formula:

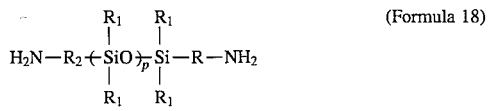

(Formula 18)

-continued or $$H_2N-R_4-O \mathord{\left(SiO\right)_{\overline{q}}} R_4-NH_2 \quad \text{(Formula 19)}$$

with $R_1$ on the Si (top and bottom substituents).

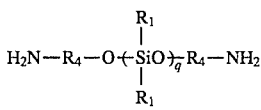

(wherein $R_1$ and $R_3$ are a monovalent organic group, $R_2$ and $R_4$ are a divalent organic group, and p and q are an integer greater than 1) may be used as part of the aromatic diamine.

The highly adhesive thin film according to this invention is a film of a polymer with a flexible skeleton having at least one highly flexible bond —Ar—X—Ar— (X being a divalent organic group with high flexibility) in the main chain and capable of fully exhibiting inherent high heat resistance of low-thermal-expansivity polyimide. The polymer is selected from the polyimides composed of benzoxazole resin, benzothiazole resin, maleimide resin and the following monomers: aromatic diamines such as 4,4'-diaminodiphenyl ether, 4,4'-diaminodiphenylsulfone, 4,4'-diaminodiphenylmethane, 4,4'-diaminodiphenyl sulfide, 4,4'-diaminodicyclohexyl-methane, 4,4'-bis(paraaminophenoxy)biphenyl, 4,4'-bis(methaaminophenoxy)diphenylsulfone, 2,2'-bis(4-(paraaminophenoxy)phenyl)propane, 3,3'-dimethyl-4,4'-diaminodiphenylmethane, 2,2'-bis(4-(paraaminophenoxy)phenyl)hexafluoropropane, 4,4'-diaminobenzophenone, 4,4'-bis(paraaminophenoxy)diphenylsulfone and 4,4'-dithiodianiline; acid dianhydrides such as 3,3',4,4'-benzophenonetetracarboxylic acid dianhydride, 2,2-bis(4-(3,4-dicarboxyphenoxy)phenyl)propanoic acid dianhydride, 2,2-bis(4-(3,4-dicarboxyphenoxy)phenyl)hexafluoropropanoic acid dianhydride, 3,3',4,4'-diphenylethertetracarboxylic acid dianhydride, 3,3',4,4'-diphenylsulfonetetracarboxylic acid dianhydride, 2,2-bis(3,4-dicarboxyphenyl)propanoic acid dianhydride and 2,2-bis(3,4-dicarboxyphenyl)hexafluoropropanoic acid dianhydride. In case of using an aromatic diamine such as mentioned above, pyromellitic acid dianhydride or 3,3',4,4'-biphenyltetracarboxylic acid dianhydride may be used as acid dianhydride.

Such a polymer can be obtained from single polymerization of an aromatic diaminocarboxylic acid derivative or from reaction of an aromatic diamine or an aromatic diisocyanate and an aromatic tetracarboxylic acid derivative.

In the present invention, it is essential that the thickness of the highly adhesive thin film is less than 20% of the thickness of the low-thermal-expansivity polyimide film. The polyimide used for the highly adhesive thin film has a large coefficient of thermal expansion owing to the flexible skeleton of the main chain. Therefore, increase of the amount of the highly adhesive thin film present in the insulating layer may result in loss of low thermal expansivity of the polyimide film as a whole, so that it is desirable that said thin film is as small in thickness as possible.

The film of a polyimide having a flexible skeleton, when the upper layer is formed after the lower layer has been perfectly hardened, shows far higher adhesion than between the films of a low-thermal-expansivity polyimide having a rod-like structure. This is considered attributable to the fact that the polyimide having a flexible skeleton is more likely to develop entanglement of molecules than the polyimide having a rod-like skeleton and tends to form a thick diffusion layer. Therefore, adhesion between the insulating layers can be enhanced by forming an interface of the flexible polyimide films at the interface of the low-thermal-expansivity polyimide films. Low thermal expansivity of the multilayered film as a whole can be maintained by controlling the thickness of the flexible polymer film to be less than 20% of the thickness of the low-thermal-expansivity polyimide film.

The examples of the present invention will be described stepwise below with reference to the accompanying drawings.

EXAMPLE 1–4

Figure 2A:
FIGS. 2 (a)–(c) are the sectional views showing the process of manufacturing a multilayer wiring structure.
Figure 2B:
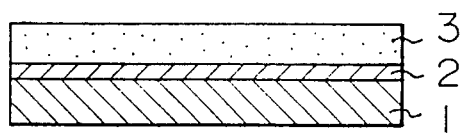
Figure 2C:
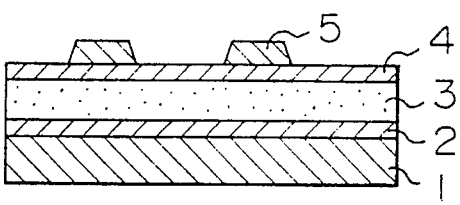
Figure 3:
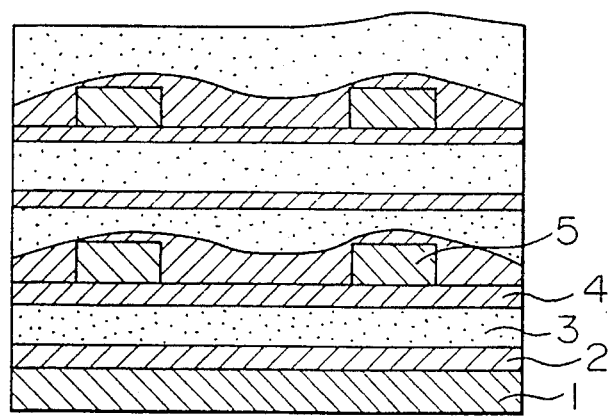
FIG. 3 is a sectional view of a high-density multilayer wiring board having a plurality of wirings.

As shown in FIG. 2 (a), a thin polyimide film 2 having flexibility is formed on a substrate 1. As the polyimide for forming the interface modifying film, there was used a varnish of a polyamide acid obtained by reacting 1 mole of an aromatic diamine shown below and 1 mole of an aromatic tetracarboxylic acid dianhydride shown below in N-methylpyrrolidone.

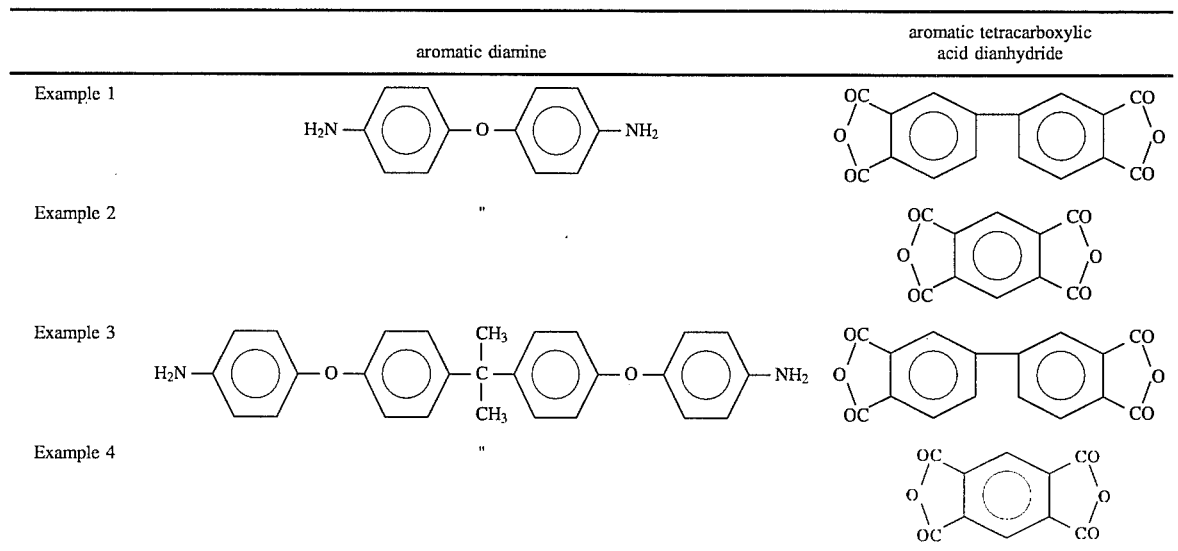

The varnish is spin coated on the substrate and cured first at 100° C. for one hour and then at 200° C. for 30 minutes (into a half-cured state) to form a 0.5–1 μm thick film.

Then a low-thermal-expansivity polyimide layer 3 is formed as shown in FIG. 2 (b). As the low-thermal-expansivity polyimide, there was used a varnish of a polyamide acid obtained by reacting 1 mole of p-PDA (p-phenylenediamine) and 1 mole of s-BPDA (3,3',4,4'-biphenyltetracarboxylic acid dianhydride) in NMP (N-methylpyrrollidone), and this varnish was spin coated on the substrate to form a 10–20 μm thick film of a half-cured state.

Further, as shown in FIG. 2 (c), a flexible polyimide thin film 4 is formed (film thickness: 0.5–1 μm by curing the coating at 100° C. for one hour and then at 350° C. for 30 minutes (into a perfectly cured state), followed by application of metallic wiring 5. Said flexible polyimide thin film was formed from a varnish obtained by using 1 mole of DDE as diamine and 1 mole of s-BPDA as acid dianhydride.

Thereafter, as shown in FIG. 1, an interface modifying thin film 6 (0.5–1 μm thick) is again formed in a half-cured state from 1 mole of a diamine shown below and 1 mole of an acid dianhydride shown below, and a low-thermal-expansivity polyimide film 7 (10–20 μm thick) is further formed thereon in a half-cured state.

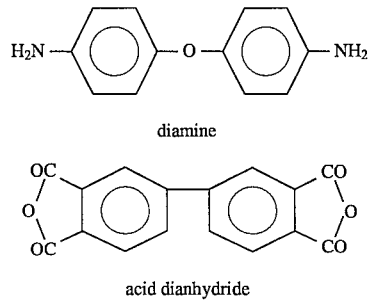

diamine acid dianhydride

Figure 4A:
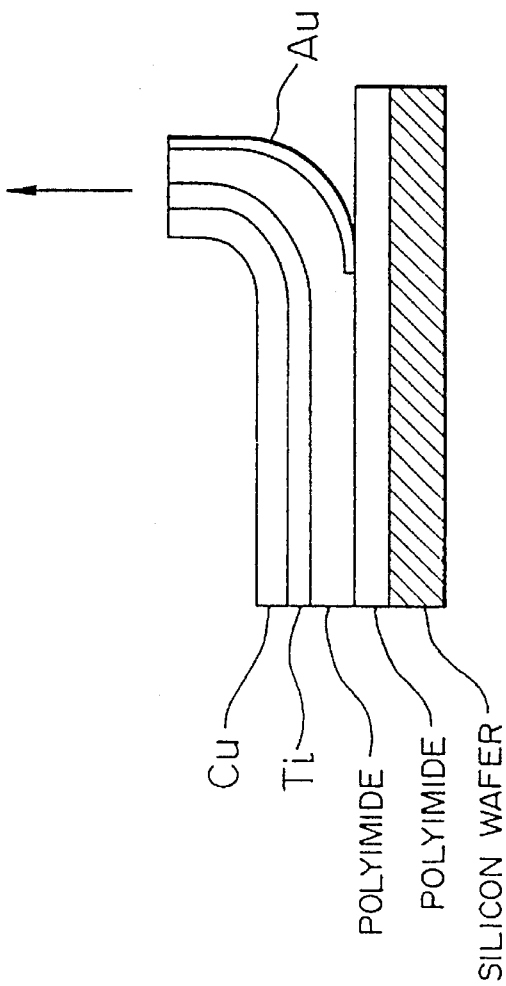
FIGS. 4 (a) and (b) are the sectional views showing the measurement of peel strength.
Figure 4B:
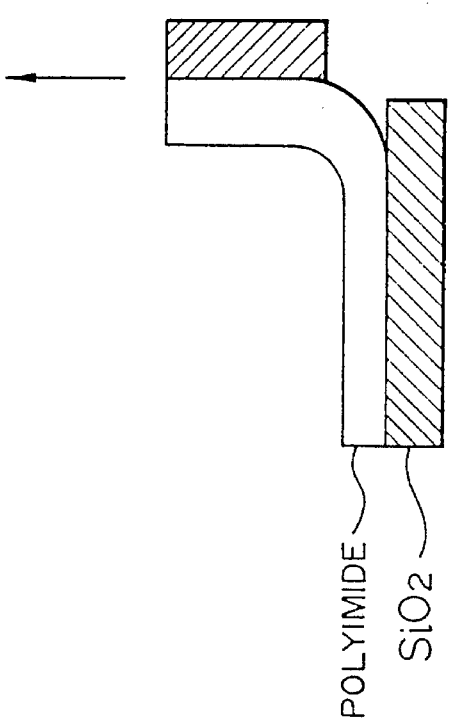

Peel strength was measured by a peeling test using the samples shown in FIG. 4. These samples were fabricated as follows:

(1) Sample A for polyimide coated on $SiO_2$. Polyamic acid varnish, spincoated on the thermally oxidized Si wafer, was converted to polyimide at 400° C. for Comparative Example 1 and at 350° C. for the others (i.e. Examples 1–4) for 30 min. (FIG. 4 (a)).

(2) Sample B for polyimide-polyimide interface on full cured polyimides; Aluminum chelate solution as an adhesion promoter was used on the substrate before spin coating of polyamic acid to form the first layer. Gold thin film was deposited on part of the first layer as a delamination layer. The second layer was fabricated by spin coating and thermal imidization on the first layer. The curing conditions for both layers were the same as for sample A. A Cr and Cu layer was deposited as the reinforcement layer for the peeling test (FIG. 4 (b)).

(3) Sample C for polyimide-polyimide interface on semi cured polyimides. The polyimide first layer was fabricated by spin coating on aluminum-chelate solution-applied substrate. Thermal imidization was done at temperatures between 150° and 300° C. for 30 min. Other steps were the same as for sample B.

TABLE 1

| Adhesive thin film | | Peel strength (1) g/cm | Peel strength (2) g/cm | Heat resistance (°C.) | Reliability |
|---|---|---|---|---|---|
| Example 1 | [structure: BPDA-ODA polyimide unit] | 750 | 550 | 460 | Good |
| Example 2 | [structure: PMDA-ODA polyimide unit] | 460 | 380 | 435 | Good |
| Example 3 | [structure: BPDA-BAPP-type polyimide unit with isopropylidene] | 470 | 400 | 410 | Good |
| Example 4 | [structure: PMDA-BAPP-type polyimide unit with isopropylidene] | 690 | 490 | 410 | Good |
| Comp. Example 1 | [structure: BPDA-phenylenediamine polyimide unit] | <10 | <10 | 510 | Bad |
| Comp. Example 2 | Epoxy resin | 1500 | 1500 | <300 | Bad |

TABLE 1-continued

|  | Adhesive thin film | Peel strength (1) g/cm | Peel strength (2) g/cm | Heat resistance (°C.) | Reliability |
|---|---|---|---|---|---|
| Comp. Example 3 | Devoid of adhesive layers 3 and 4. | <10 | <10 | " | Bad |
| Comp. Example 4 | Devoid of adhesive layer 3. | <10 | <10 | " | Bad |
| Comp. Example 5 | Devoid of adhesive layer 4. | <10 | <10 | " | Bad |

Peel strength (1): polyimide/polyimide 90° peel strength
Peel Strength (2): polyimide/wiring metal 90° peel strength
Heat resistance: temperature at which weight loss began in the air

EXAMPLE 5

FIG. 1 shows an example of trial manufacture of a high-density multilayer wiring board using a highly adhesive polyimide shown in Example 1.

On the surface of a 1 mm thick, 100 mm² alumina substrate 1 was deposited a thin copper film 8. (a) After applying and hardening a resist, a pattern was formed, and after forming a first wiring layer 5 by electroplating, the resist was removed. (b) The polyimide precursor varnish of Example 1 was spin coated thereon and the coat was cured in a nitrogen atmosphere at 200° C. for 30 minutes to form an about 1 μm thick flexible polyimide film 2. (c) On this film was similarly formed a low-thermal-expansivity polyimide film 3 with a thickness of about 20 μm. (d) Further formed thereon, in the similar way, was an about 1 μm thick polyimide film 4, the same as formed in Example 1.

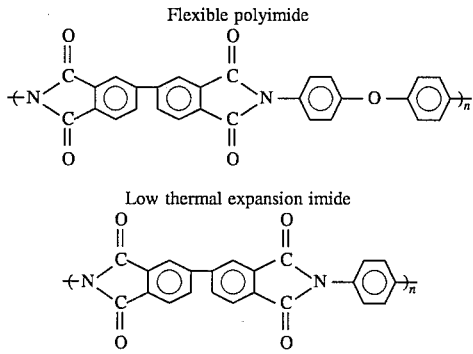

In this step, the curing temperature was raised to 400° C. to perfectly imidate the three layers at the same time. Thereafter, the steps of (a) and (b) were repeated to form a 10-layer wiring board. The respective wiring layers were connected by a connecting pedestal. Each wiring layer was about 5 μm thick and the pedestal had a thickness of about 10 μm.

According to the present invention, it is possible to provide a multilayer wiring structure with high reliability in which a low-thermal-expansivity polyimide is used for forming the layer insulating films and adhesion between the low-thermal-expansivity polyimide film and the wiring pattern layer is improved.

We claim:

1. A method for producing a multilayer wiring structure comprising a plural number of conductor pattern layers and a plural number of low-thermal-expansivity polyimide insulating film layers, the low-thermal expansivity polyimide forming the insulating film layers having a coefficient of thermal expansion of $2 \times 10^{-5} K^{-1}$ to $4 \times 10^{-6} K^{-1}$, which method comprises the steps of:

(A) coating a flexible polymer resin on a substrate and heat-curing the polymer coating into a half-cured state;

(B) applying on said polymer coating a polyamic acid varnish which is a low-thermal-expansivity polyimide precursor and forming a polyimide of a half-cured state by conducting a thermal condensation reaction;

(C) applying on said polyimide a flexible polymer resin and heating it to form a flexible polymer film into a perfectly cured state;

(D) bonding a copper foil on said flexible polymer film and etching said copper foil layer to form a conductor pattern layer;

(E) coating a flexible polymer varnish on said conductor pattern layer and heat curing the polymer coating into a half-cured state;

(F) applying on said polymer coating a polyamic acid varnish which is a low-thermal-expansivity polyimide precursor and subjecting the precursor to a thermal condensation reaction to form a polyimide layer into a half-cured state;

(G) coating a flexible polymer varnish on the low-thermal-expansivity polyimide layer and heating the coating to form a polymer film into a perfectly cured state; and repeating the steps (D)–(E)–(F)–(G) at least once.

2. A method for producing a multilayer wiring structure comprising a plural number of conductor pattern layers and a plural number of low-thermal-expansivity polyimide insulating film layers, the low-thermal expansivity polyimide forming the insulating film layers having a coefficient of thermal expansion of $2 \times 10^{-5} K^{-1}$ to $4 \times 10^{-6} K^{-1}$, which method comprises the steps of:

(A) depositing a thin copper film on a substrate;

(B) applying and hardening a resist on said thin copper film and etching it to form a pattern;

(C) forming a conductor pattern by electroplating of a metal and removing the resist;

(D) coating a flexible polymer varnish on said conductor pattern layer and heat curing the polymer coating to form a polymer coating film into a half-cured state;

(E) applying on said polymer coating film a varnish of polyamic acid which is a low-thermal-expansivity polyimide precursor, and subjecting the precursor to a thermal condensation reaction to form a polyimide layer into a half-cured state;

(F) coating a flexible polymer varnish in the low-thermal-expansivity polyimide film and heating the coating to form a polymer coating film into a perfectly cured state;

(G) depositing a thin copper film on said polymer coating film; and repeating the steps (B)–(C)–(D)–(E)–(F)–(G) at least once.

3. A method for producing a multilayer wiring structure comprising a plural number of conductor pattern layers and a plural number of low-thermal-expansivity polyimide insulating film layers, the low-thermal expansivity polyimide forming the insulating film layers having a coefficient of thermal expansion of $2\times10^{-5}K^{-1}$ to $4\times10^{-6}K^{-1}$, which method comprises the steps of:

(A) depositing a thin copper film on a substrate;

(B) applying and hardening a resist on said thin copper film and etching it to form a thin film pattern;

(C) coating thereon a flexible polymer varnish and heat curing it to form a polymer coating film into a half-cured state;

(D) applying on said polymer coating film a varnish of polyamic acid which is a low-thermal-expansivity polyimide precursor and subjecting the precursor to a thermal condensation reaction to form a polyimide layer into a half-cured state;

(E) coating a flexible polymer varnish on said polyimide layer and heating the coating to form a polymer coating film into a perfectly cured state;

(F) forming a conductor pattern layer on said polymer coating film by chemical plating; and repeating the steps (B)–(C)–(D)–(E)–(F) at least once.

* * * * *